US012239020B2

United States Patent
Yamasaki et al.

(10) Patent No.: US 12,239,020 B2
(45) Date of Patent: Feb. 25, 2025

(54) THERMOELECTRIC CONVERSION MODULE

(71) Applicant: LINTEC CORPORATION, Tokyo (JP)

(72) Inventors: Toshiya Yamasaki, Saitama (JP); Kunihisa Kato, Warabi (JP); Yuta Seki, Kawasaki (JP)

(73) Assignee: LINTEC CORPORATION, Tokyo (JP)

( * ) Notice: Subject to any disclaimer, the term of this patent is extended or adjusted under 35 U.S.C. 154(b) by 23 days.

(21) Appl. No.: 17/913,487

(22) PCT Filed: Mar. 18, 2021

(86) PCT No.: PCT/JP2021/011109
§ 371 (c)(1),
(2) Date: Sep. 22, 2022

(87) PCT Pub. No.: WO2021/193357
PCT Pub. Date: Sep. 30, 2021

(65) Prior Publication Data
US 2023/0133754 A1 May 4, 2023

(30) Foreign Application Priority Data
Mar. 25, 2020 (JP) .................................. 2020-054840

(51) Int. Cl.
*H10N 10/852* (2023.01)
*H10N 10/855* (2023.01)
*H10N 10/857* (2023.01)

(52) U.S. Cl.
CPC ......... *H10N 10/852* (2023.02); *H10N 10/855* (2023.02); *H10N 10/857* (2023.02)

(58) Field of Classification Search
None
See application file for complete search history.

(56) References Cited

U.S. PATENT DOCUMENTS

2014/0174495 A1* 6/2014 Nakaya .................. H10N 10/17
136/204
2017/0373240 A1* 12/2017 Kato ...................... H10N 10/17
(Continued)

FOREIGN PATENT DOCUMENTS

CN       101656292 A    2/2010
CN       108963064 A    12/2018
(Continued)

OTHER PUBLICATIONS

English language machine translation of Washino et al. (JP 01-042184). (Year: 2023).*
(Continued)

*Primary Examiner* — Eli S Mekhlin
(74) *Attorney, Agent, or Firm* — Element IP, PLC

(57) ABSTRACT

Provided is a thermoelectric conversion module including a thermoelectric conversion material layer that has high thermoelectric performance, the thermoelectric conversion material layer containing a thermoelectric conversion material with its electrical resistivity reduced. The thermoelectric conversion module includes the thermoelectric conversion material layer including the thermoelectric conversion material containing at least thermoelectric semiconductor particles. The thermoelectric conversion material layer has voids, and when a proportion of the area occupied by the thermoelectric conversion material within the area of a longitudinal cross-section that includes the center portion of the thermoelectric conversion material layer is defined as a filling ratio, the filling ratio is greater than 0.900 and less than 1.000.

15 Claims, 6 Drawing Sheets

(56) References Cited

U.S. PATENT DOCUMENTS

2019/0051807 A1* 2/2019 Okumura ............. H10N 10/817
2020/0028052 A1* 1/2020 Poudeu-Poudeu ..... H10N 10/01

FOREIGN PATENT DOCUMENTS

| JP | S6442184 A | 2/1989 | | |
|----|------------|--------|---|---|
| JP | 2013219095 A | 10/2013 | | |
| JP | 2017098282 A | 6/2017 | | |
| JP | 2017098284 A | 6/2017 | | |
| TW | 201917917 A | 5/2019 | | |
| TW | 201941462 A | 10/2019 | | |
| WO | WO-2016104615 A1 | 6/2016 | | |
| WO | WO-2017222853 A1 * | 12/2017 | ............. | H01L 35/04 |
| WO | WO-2018143598 A1 | 8/2018 | | |
| WO | WO-2018168837 A1 | 9/2018 | | |

OTHER PUBLICATIONS

International Search Report issued May 11, 2021 in PCT/JP2021/011109 (with English translation), 6 pages.
Combined Taiwanese Office Action and Search Report issued Jul. 3, 2024 in corresponding Taiwanese Patent Application No. 110110348 (with English translation), 14 pages.

* cited by examiner

THERMOELECTRIC CONVERSION MODULE

TECHNICAL FIELD

The present invention relates to a thermoelectric conversion module.

BACKGROUND ART

Typically, one means for effectively utilizing energy is a device that directly inter-converts thermal energy and electrical energy using a thermoelectric conversion module having a thermoelectric effect such as a Seebeck effect or a Peltier effect.

As such a thermoelectric conversion module, a configuration of a so-called π-type thermoelectric conversion device is known. The π-type thermoelectric conversion device is configured by providing, on a substrate, a pair of electrodes that are mutually spaced apart, for example, providing a P-type thermoelectric device on one electrode and an N-type thermoelectric device on the other electrode with the electrodes being similarly spaced apart from each other, and connecting the upper surfaces of both of the thermoelectric devices to the electrodes of an opposing substrate. In addition, the use of a so-called in-plane type thermoelectric conversion device is also known. The in-plane type thermoelectric conversion device includes P-type thermoelectric devices and N-type thermoelectric devices alternately provided on a substrate in the in-plane direction, and for example, it is configured by connecting the lower part of the joint between both of the thermoelectric devices through electrodes in series.

Under such circumstances, the thermoelectric conversion modules with improved bendability, reduced thickness, and improved thermoelectric performance and so on are required. In order to satisfy these requirements, for example, the substrate to be used in the thermoelectric conversion module includes a resin substrate such as polyimide from the perspective of heat resistance and bendability. Also, as an N-type thermoelectric semiconductor material and a P-type thermoelectric semiconductor material, thin films of bismuth telluride-based materials are used from the perspective of thermoelectric performance, and from the perspective of bendability, thinning, or the like, thermoelectric semiconductor compositions including a resin and a thermoelectric semiconductor material are formed in an aspect of coating films using screen printing or the like. For example, see Patent Literature 1.

CITATION LIST

Patent Literature

Patent Literature 1: WO 2016/104615

SUMMARY OF INVENTION

Technical Problem

However, the thermoelectric conversion module has not been able to sufficiently reduce the electrical resistivity of a thermoelectric conversion material in a thermoelectric conversion material layer, and the thermoelectric performance is not sufficient.

In view of the above, an object of the present invention is to provide a thermoelectric conversion module including a thermoelectric conversion material layer that has high thermoelectric performance, the thermoelectric conversion material layer containing a thermoelectric conversion material with its electrical resistivity reduced.

Solution to Problem

As a result of diligent research to solve the above-described problems, the present inventors have found that, when the thermoelectric conversion material layer in the thermoelectric conversion module has voids, and a filling ratio, which is defined as a proportion of the area occupied by the thermoelectric conversion material within the area of the longitudinal cross-section that includes the center portion of the thermoelectric conversion material layer, is greater than 0.900 and less than 1.000, the electrical resistivity of the thermoelectric conversion material in the thermoelectric conversion material layer can be reduced, thereby improving the thermoelectric performance of the thermoelectric conversion material layer. Furthermore, the present inventors have found that, by using a thermoelectric semiconductor composition containing a resin binder that decomposes at a low temperature, the voids in the thermoelectric conversion material layer can be reduced, thereby improving the filling ratio, and thus completed the present invention.

That is, the present invention provides the following (1) to (5).

(1) A thermoelectric conversion module including a thermoelectric conversion material layer, the thermoelectric conversion material layer including a thermoelectric conversion material containing at least a thermoelectric semiconductor particle, in which the thermoelectric conversion material layer has a void, and when a proportion of an area occupied by the thermoelectric conversion material within an area of a longitudinal cross-section that includes a center portion of the thermoelectric conversion material layer is defined as a filling ratio, the filling ratio is greater than 0.900 and less than 1.000.

(2) The thermoelectric conversion module according to (1), in which the thermoelectric conversion material layer includes a fired body of a coating film of a thermoelectric semiconductor composition, the thermoelectric semiconductor composition containing a thermoelectric semiconductor particle and a binder resin.

(3) The thermoelectric conversion module according to (2), in which the binder resin decomposes by 90 mass % or greater at a firing temperature of the fired body.

(4) The thermoelectric conversion module according to (2) or (3), in which the binder resin includes at least one selected from a polycarbonate, a cellulose derivative, and a polyvinyl polymer.

(5) The thermoelectric conversion module according to (4), in which the binder resin is a polycarbonate.

(6) The thermoelectric conversion module according to any one of (2) to (5), in which the thermoelectric semiconductor composition further comprises an ionic liquid and/or an inorganic ionic compound.

(7) The thermoelectric conversion module according to any one of (1) to (6), in which the thermoelectric semiconductor particle includes a bismuth-tellurium-based thermoelectric semiconductor material, a telluride-based thermoelectric semiconductor material, an antimony-tellurium-based thermoelectric semiconductor material, or a bismuth selenide-based thermoelectric semiconductor material.

Advantageous Effects of Invention

The present invention can provide a thermoelectric conversion module including a thermoelectric conversion material layer that has high thermoelectric performance, the thermoelectric conversion material layer containing a thermoelectric conversion material with its electrical resistivity reduced.

DESCRIPTION OF EMBODIMENTS

Thermoelectric Conversion Module

The thermoelectric conversion module according to the present invention includes at least a thermoelectric conversion material layer, and as necessary, further includes an electrode, a resin film, a joining material layer, a solder receiving layer, and the like, as described in the section entitled "Method for manufacturing thermoelectric conversion module" described below.

It is preferable that the thermoelectric conversion module be manufactured by mounting (disposing) a chip including a P-type thermoelectric conversion material and a chip including N-type thermoelectric conversion materials as a thermoelectric conversion material layer in such a manner that the chips are connected via electrodes to achieve a configuration for a π-type or in-plane type thermoelectric conversion module.

Thermoelectric Conversion Material Layer

The thermoelectric conversion material layer is made of a thermoelectric conversion material, has voids, and has a filling ratio of greater than 0.900 and less than 1.000 as measured by the method of the examples described below, the filling ratio being defined as a proportion of the area occupied by the thermoelectric conversion material within the area of the longitudinal cross-section that includes the center portion of the thermoelectric conversion material layer.

Note that in the present specification, the "thermoelectric conversion material" means a product obtained by firing a thermoelectric semiconductor composition (e.g., a fired body of a coating film of a thermoelectric semiconductor composition). In addition, even if a binder resin described below is contained in the thermoelectric semiconductor composition, when the binder resin is completely decomposed by firing, the binder resin is deemed no longer contained in the thermoelectric conversion material.

Longitudinal Cross-Section of Thermoelectric Conversion Material Layer

The definition of the "longitudinal cross-section that includes the center portion of the thermoelectric conversion material layer" given herein will be explained with reference to the drawings.

Figure 1:
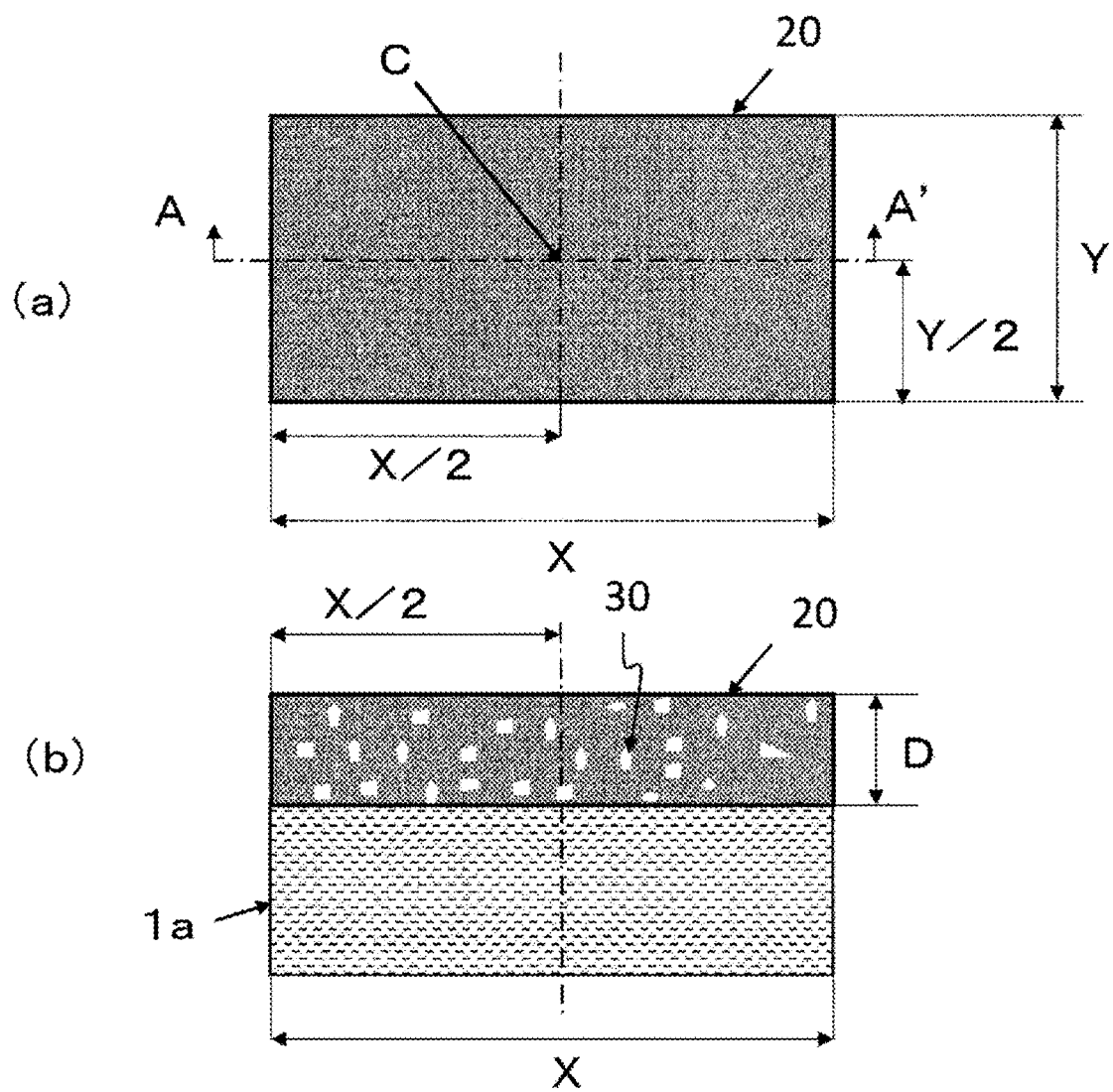
FIG. 1 is diagrams illustrating a definition of the longitudinal cross-section of a thermoelectric conversion material layer in a thermoelectric conversion module of the present invention.

FIG. 1 includes diagrams illustrating the definition of the longitudinal cross-section of the thermoelectric conversion material layer in the thermoelectric conversion module of the present invention, FIG. 1($a$) is a plan view of a thermoelectric conversion material layer 20, and the thermoelectric conversion material layer 20 has a length X in the width direction and a length Y in the depth direction. FIG. 1($b$) illustrates a longitudinal cross-section of the thermoelectric conversion material layer 20 formed on a substrate 1$a$, and the longitudinal cross-section includes a center portion C in FIG. 1($a$), and has a length X and a thickness D when cut along A-A' in the width direction. Note that the thermoelectric conversion material layer 20 includes a void portion 30.

The longitudinal cross-section of the thermoelectric conversion material layer in the thermoelectric conversion module of the present invention will be described using the drawings.

Figure 2:
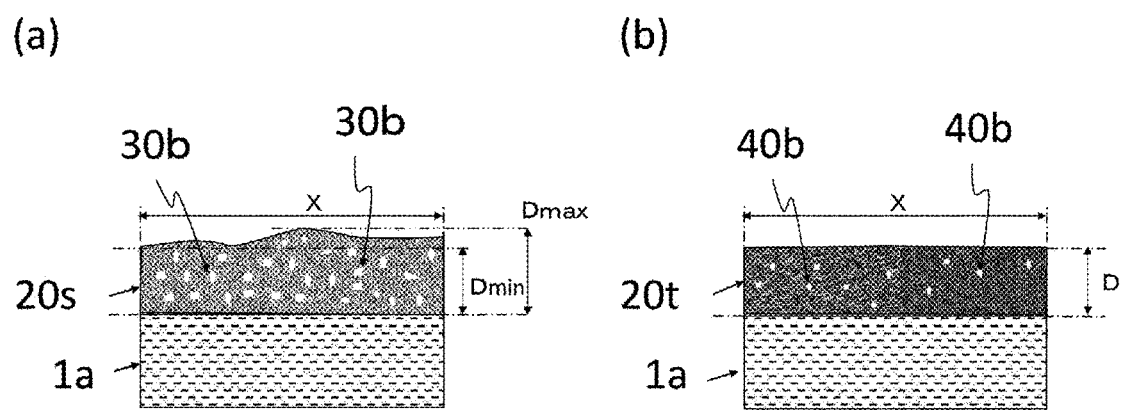
FIG. 2 is schematic cross-sectional views illustrating the longitudinal cross-section of the thermoelectric conversion material layer in the thermoelectric conversion module of the present invention.

FIG. 2 includes schematic cross-sectional views for illustrating the longitudinal cross-section of the thermoelectric conversion material layer in the thermoelectric conversion module of the present invention. FIG. 2($a$) is an example of a longitudinal cross-section of a thermoelectric conversion material layer 20$s$ formed on the substrate 1$a$. The thermoelectric conversion material layer 20$s$ has a longitudinal cross-section formed of a curve having a length X in the width direction and values of Dmin and Dmax in the thickness direction, and an upper part of the longitudinal cross-section includes a concave portion and a convex portion. In the longitudinal cross-section, a void portion 30$b$ is present. In addition, FIG. 2($b$) is an example of a longitudinal cross-section of a thermoelectric conversion material layer 20$t$ formed on the substrate 1$a$, and the longitudinal cross-section of the thermoelectric conversion material layer 20$t$ has the length X in the width direction and the thickness D in the thickness direction [when the values of Dmin and Dmax in FIG. 2($a$) are slightly different]. An upper part of the longitudinal cross-section includes a concave portion and a convex portion. In the longitudinal cross-section, a void portion 40$b$ is present, in which a number of voids and volume are suppressed. Note that Dmin means a minimum value of the thickness in the thickness direction of the longitudinal cross-section, and Dmax means a maximum value of the thickness in the thickness direction of the longitudinal cross-section.

In the thermoelectric conversion material layer in the thermoelectric conversion module of the present invention, a filling ratio of the thermoelectric conversion material in the thermoelectric conversion material layer is greater than 0.900 and less than 1.000, the filling ratio being defined as a proportion of the area occupied by the thermoelectric conversion material within the area of the longitudinal cross-section including the center portion of the thermoelectric conversion material layer, and the number of voids in the thermoelectric conversion material layer is small.

When the filling ratio of the thermoelectric conversion material in the thermoelectric conversion material layer is 0.900 or less, the voids in the thermoelectric conversion material layer increase, and it is difficult to reduce the electrical resistivity of the thermoelectric conversion material in the thermoelectric conversion material layer (it becomes difficult to obtain an excellent electrical conductivity), and high thermoelectric performance cannot be achieved. The filling ratio is preferably greater than 0.900 and 0.999 or less, more preferably not less than greater than 0.920 and 0.999 or less, even more preferably 0.950 or greater and 0.999 or less, and particularly preferably 0.970 or greater and 0.999 or less. When the filling ratio is within the range, the electrical resistivity of the thermoelectric conversion material in the thermoelectric conversion material layer is reduced (excellent electrical conductivity is obtained), and high thermoelectric performance can be obtained.

The filling ratio of the thermoelectric conversion material in the thermoelectric conversion material layer is measured by the method which will be described in the examples.

The thermoelectric conversion material layer in the thermoelectric conversion module of the present invention is preferably formed from a fired body of a coating film of the thermoelectric semiconductor composition. The thermoelectric semiconductor composition contains at least thermoelectric semiconductor particles, preferably contains at least a binder resin from the perspective of shape stability of the thermoelectric conversion material layer, and more preferably further contains at least either one of an ionic liquid or an inorganic ionic compound from the perspective of the thermoelectric performance of the heat conversion material layer.

The fired body is obtained by firing the coating film of the thermoelectric semiconductor composition at a firing temperature. The firing temperature is typically determined depending on the type of thermoelectric semiconductor particles contained in the thermoelectric semiconductor composition, and is typically from 260 to 500° C., preferably from 400 to 460° C., more preferably from 410 to 450° C., and particularly preferably from 420 to 450° C. Note that, in the examples, the firing temperature is 430° C.

The thickness of the thermoelectric conversion material layer is not particularly limited, but is preferably from 1 nm to 1000 μm, more preferably from 3 to 600 μm, and even more preferably from 5 to 400 μm from the perspective of flexibility, thermoelectric performance and film strength.

Thermoelectric Semiconductor Particle

The thermoelectric semiconductor particles are obtained by grinding a thermoelectric semiconductor material, described below, to a predetermined size using a fine grinding device or the like.

The thermoelectric semiconductor material is not particularly limited as long as the thermoelectric semiconductor material is a raw material that can generate thermoelectromotive force by providing a temperature difference. For example, bismuth-tellurium-based thermoelectric semiconductor materials such as P-type bismuth telluride and N-type bismuth telluride; telluride-based thermoelectric semiconductor materials such as GeTe and PbTe; antimony-tellurium-based thermoelectric semiconductor materials; zinc-antimony-based thermoelectric semiconductor materials such as ZnSb, $Zn_3Sb_2$, and $Zn_4Sb_3$; silicon-germanium-based thermoelectric semiconductor materials such as SiGe; bismuth selenide-based thermoelectric semiconductor materials such as $Bi_2Se_3$; silicide-based thermoelectric semiconductor materials such as β-$FeSi_2$, $CrSi_2$, $MnSi_{1.73}$, $Mg_2Si$; oxide-based thermoelectric semiconductor materials; Heusler materials such as FeVAl, FeVAlSi, and FeVTiAl; and sulfide-based thermoelectric semiconductor materials such as $TiS_2$ are used. One of these may be used alone, or two or more may be used in combination.

Among these, a bismuth-tellurium-based thermoelectric semiconductor material, a telluride-based thermoelectric semiconductor material, an antimony-tellurium-based thermoelectric semiconductor material, or a bismuth selenide-based thermoelectric semiconductor material is preferable. From the viewpoint of obtaining a high thermoelectric performance, a bismuth-tellurium-based thermoelectric semiconductor material such as P-type bismuth telluride or N-type bismuth telluride is more preferable.

As the P-type bismuth telluride, a P-type bismuth telluride having a positive hole as a carrier and the Seebeck coefficient of a positive value and, for example, represented as $Bi_XTe_3Sb_{2-X}$ is preferably used. In this case, X is preferably $0 < X \leq 0.8$, and more preferably $0.4 \leq X \leq 0.6$. When X is greater than 0 and less than or equal to 0.8, the Seebeck coefficient and electrical conductivity increase, and the characteristics as a P-type thermoelectric element are maintained, and thus X is preferably within this range.

Furthermore, as the N-type bismuth telluride, an N-type bismuth telluride having an electron as a carrier and the Seebeck coefficient of a negative value and, for example, represented as $Bi_2Te_{3-Y}Se_Y$ is preferably used. In this case, Y preferably satisfies $0 \leq Y \leq 3$ (when Y=0: $Bi_2Te_3$), and more preferably satisfies $0 < Y \leq 2.7$. When Y is from 0 to 3, the Seebeck coefficient and electrical conductivity increase, and the characteristics as an N-type thermoelectric element are maintained, and thus Y is preferably within this range.

A content of the thermoelectric semiconductor particles in the thermoelectric semiconductor composition is preferably from 30 to 99 mass %, more preferably from 50 to 96 mass %, and particularly preferably from 70 to 95 mass %. If the content of the thermoelectric semiconductor particles is within the range described above, the Seebeck coefficient (absolute value of the Peltier coefficient) is large, a decrease in electrical conductivity is suppressed, and only thermal conductivity is reduced, and therefore a film exhibiting a high thermoelectric performance and having sufficient film strength and bendability is obtained. Thus, the compounded amount of the thermoelectric semiconductor particles is preferably within the range described above.

The content of the thermoelectric semiconductor particles in the thermoelectric conversion material is preferably from 80 to 100 mass %, more preferably from 90 to 100 mass %, even more preferably from 95 to 100 mass %, particularly preferably from 99 to 100 mass %, and most preferably from 99.9 to 100 mass %. The content of the thermoelectric semiconductor particles in the thermoelectric conversion material falling within the range described above is preferred because the Seebeck coefficient (absolute value of Peltier coefficient) is large, high thermoelectric performance is exhibited since reduction of the electrical conductivity is suppressed and only thermal conductivity decreases, and a film having an adequate film strength and appropriate flexibility can be obtained.

An average particle size of the thermoelectric semiconductor particles is preferably from 10 nm to 200 μm, more preferably from 10 nm to 30 μm, even more preferably from 50 nm to 10 μm, and particularly preferably from 1 to 6 μm. When the average particle size is in the range above, uniform dispersion is facilitated and a high electrical conductivity can be achieved.

The method for obtaining the thermoelectric semiconductor particles by grinding the thermoelectric semiconductor material is not particularly limited, and the material may be ground to a predetermined size using a known fine grinding device such as a jet mill, a ball mill, a bead mill, a colloid mill, or a roller mill.

Note that the average particle size of the thermoelectric semiconductor particles is obtained by measuring using a laser diffraction particle size analyzer (Mastersizer 3000 available from Malvern Panalytical Ltd.), and using the median from the particle size distribution.

Furthermore, the thermoelectric semiconductor particles are preferably heat-treated in advance. When the thermoelectric semiconductor particles are heat-treated, the crystallinity of the thermoelectric semiconductor particles is improved, and a surface oxide film of the thermoelectric semiconductor particles is removed, and therefore the Seebeck coefficient or the Peltier coefficient of the thermoelectric conversion material increases, and the thermoelectric performance index can be further improved. The heat treatment is not particularly limited, and the heat treatment is preferably performed in an inert gas atmosphere, such as nitrogen or argon, or a reducing gas atmosphere such as hydrogen, in which gas flow rate is controlled in a manner that the thermoelectric semiconductor particles are not negatively affected, or in a vacuum condition prior to preparation of the thermoelectric semiconductor composition, and is more preferably performed in a mixed gas atmosphere of an inert gas and a reducing gas. The specific temperature conditions depend on the thermoelectric semiconductor particles that are used, but typically the annealing treatment A is preferably implemented for several minutes to several tens of hours at a temperature that is equal to or lower than the melting point of the particles and is from 100 to 1500° C.

Binder Resin

The thermoelectric semiconductor composition preferably contains a binder resin in addition to the above-mentioned thermoelectric semiconductor particles. The binder resin facilitates removing from a substrate, described below, used during the production of the chips of the thermoelectric conversion materials after a firing (annealing) treatment, and functions as a binder between the thermoelectric semiconductor materials (thermoelectric semiconductor particles), which makes it possible to increase the bendability of the thermoelectric conversion module, and facilitates the formation of a thin film by application or the like.

The binder resin is preferably a resin of which 90 mass % or greater decomposes at the firing (annealing) temperature, is more preferably a resin of which 95 mass % or greater decomposes at the firing temperature, and is particularly preferably a resin of which 99 mass % or greater decomposes at the firing temperature. In addition, the binder resin is more preferably a resin of which various physical properties such as mechanical strength and thermal conductivity are maintained without being impaired when crystal growth of the thermoelectric semiconductor particles is caused by subjecting a coating film (thin film) including the thermoelectric semiconductor composition to a firing (annealing) treatment or the like.

When a resin of which 90 mass % or greater decomposes at the firing (annealing) temperature, that is, a resin that decomposes at a lower temperature than that for a typically used heat-resistant resin, is used as the binder resin, the binder resin decomposes through firing, and therefore the content of the binder resin serving as an insulating component contained in the fired body is reduced, and crystal growth of the thermoelectric semiconductor particles in the thermoelectric semiconductor composition is promoted. Thus, voids in the thermoelectric conversion material layer can be reduced, and the filling ratio can be improved.

Note that whether a resin decomposes in a predetermined amount (for example, 90 mass %) or greater at the firing (annealing) temperature is determined by measuring the mass loss rate (a value obtained by dividing the mass after decomposition by the mass before decomposition) at the firing (annealing) temperature through thermogravimetry (TG).

A thermoplastic resin or a curable resin can be used as the binder resin. Examples of thermoplastic resins include polyolefin resins such as polyethylene, polypropylene, polyisobutylene, and polymethylpentene; polycarbonates; thermoplastic polyester resins such as polyethylene terephthalate and polyethylene naphthalate; polyvinyl polymers such as polystyrene, acrylonitrile-styrene copolymers, poly(vinylacetate), ethylene-vinyl acetate copolymers, vinyl chloride, poly(vinyl pyridine), poly(vinyl alcohol), and poly(vinyl pyrrolidone); polyurethanes; and cellulose derivatives such as ethyl cellulose. Examples of the curable resin include thermosetting resins and photocurable resins. Examples of thermosetting resins include epoxy resins and phenol resins. Examples of photocurable resins include photocurable acrylic resins, photocurable urethane resins, and photocurable epoxy resins. One of these may be used alone, or two or more may be used in combination.

Among these, from the perspective of electrical resistivity of the thermoelectric conversion material in the thermoelectric conversion material layer, a thermoplastic resin is preferable, a polycarbonate or a cellulose derivative such as ethyl cellulose is more preferable, and a polycarbonate is particularly preferable.

The binder resin is appropriately selected according to the temperature of a firing (annealing) treatment for the thermoelectric semiconductor material in a (B) firing (annealing) treatment step described below. From the perspective of electrical resistivity of the thermoelectric conversion material in the thermoelectric conversion material layer, the firing (annealing) treatment is preferably implemented at a temperature equal to or higher than the final decomposition temperature of the binder resin.

In the present specification, the "final decomposition temperature" refers to a temperature at which the mass loss rate at the firing (annealing) temperature as determined through thermogravimetry (TG) is 100% (mass after decomposition is 0% of the mass before decomposition).

The final decomposition temperature of the binder resin is typically from 150 to 600° C., preferably from 200 to 560° C., more preferably from 220 to 460° C., and particularly preferably from 240 to 360° C. When a binder resin having a final decomposition temperature within this range is used, the binder resin functions as a binder for the thermoelectric semiconductor material, and formation of a thin film is facilitated when printing.

The content of the binder resin in the thermoelectric semiconductor composition is from 0.1 to 40 mass %, preferably from 0.5 to 20 mass %, more preferably from 0.5 to 10 mass %, and particularly preferably from 0.5 to 5 mass %. When the content of the binder resin is within the range described above, the electrical resistivity of the thermoelectric conversion material in the thermoelectric conversion material layer can be reduced.

The content of the binder resin in the thermoelectric conversion material is preferably from 0 to 10 mass %, more preferably from 0 to 5 mass %, and particularly preferably from 0 to 1 mass %. If the content of the binder resin in the thermoelectric conversion material is within the range described above, the electrical resistivity of the thermoelectric conversion material in the thermoelectric conversion material layer can be reduced.

Ionic Liquid

The ionic liquid is a molten salt obtained by combining a cation and an anion and means a salt that can be present as a liquid in any temperature region in a temperature region of −50° C. or higher and lower than 400° C. Because the ionic liquid has characteristics such as having a significantly low vapor pressure and being nonvolatile, having excellent thermal stability and electrochemical stability, having a low viscosity, and having a high ionic conductivity, the ionic liquid can effectively suppress reduction of the electrical conductivity between the thermoelectric semiconductor particles as a conductivity aid. Furthermore, because the ionic liquid exhibits high polarity based on the aprotic ionic structure and excellent compatibility with the binder resin is achieved, the electrical conductivity of the chip of the thermoelectric conversion material can be made uniform.

As the ionic liquid, a known or commercially available ionic liquid can be used. Examples of the ionic liquid include those including (1) cation components including nitrogen-containing cyclic cation compounds and derivatives thereof, such as pyridinium, pyrimidinium, pyrazolium, pyrrolidinium, piperidinium, and imidazolium; tetraalkylammonium amine-based cations and derivatives thereof; phosphine cations and derivatives thereof, such as phosphonium, trialkylsulfonium, and tetraalkylphosphonium; and lithium cation and derivatives thereof; and (2) anion components including chloride ions such as $Cl^-$, $AlCl_4^-$, $Al_2Cl_7^-$, and $ClO_4^-$; bromide ions such as $Br^-$; iodide ions such as $I^-$; fluoride ions such as $BF_4^-$ and $PF_6^-$; halide anions such as $F(HF)n^-$; $NO_3^-$, $CH_3COO^-$, $CF_3COO^-$, $CH_3SO_3^-$, $CF_3SO_3^-$, $(FSO_2)_2N^-$, $(CF_3SO_2)_2N^-$, $(CF_3SO_2)_3C^-$, $AsF_6^-$, $SbF_6^-$, $NbF_6^-$, $TaF_6^-$, $F(HF)n^-$, $(CN)_2N^-$, $C_4F_9SO_3^-$, $(C_2F_5SO_2)_2N^-$, $C_3F_7COO^-$, and $(CF_3SO_2)(CF_3CO)N^-$. One of these may be used alone, or two or more may be used in combination.

In the ionic liquid described above, from the perspective of high temperature stability, compatibility between the thermoelectric semiconductor particles and the binder resin, suppression of reduction of the electrical conductivity between the thermoelectric semiconductor particles, and the like, the cation component of the ionic liquid preferably contains at least one type selected from the group consisting of pyridinium cations and derivatives thereof and imidazolium cations and derivatives thereof. Furthermore, the anion component of the ionic liquid preferably includes a halide anion, and more preferably includes at least one selected from $Cl^-$, $Br^-$, and $I^-$.

Specific examples of the ionic liquid in which the cation component contains the pyridinium cations and derivatives thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butylpyridinium bromide, 1-butyl-4-methylpyridinium bromide, 1-butyl-4-methylpyridinium hexafluorophosphate, and 1-butyl-4-methylpyridinium iodide. One of these may be used alone, or two or more may be used in combination.

Among these, 1-butylpyridinium bromide, 1-butyl-4-methylpyridinium bromide, 1-butyl-4-methylpyridinium hexafluorophosphate, and 1-butyl-4-methylpyridinium iodide are preferred.

Furthermore, specific examples of the ionic liquid in which the cation component contains the imidazolium cation and derivatives thereof include [1-butyl-3-(2-hydroxyethyl)imidazolium bromide], [1-butyl-3-(2-hydroxyethyl)imidazolium tetrafluoroborate], 1-ethyl-3-methylimidazolium chloride, 1-ethyl-3-methylimidazolium bromide, 1-butyl-3-methylimidazolium chloride, 1-hexyl-3-methylimidazolium chloride, 1-octyl-3-methylimidazolium chloride, 1-decyl-3-methylimidazolium chloride, 1-decyl-3-methylimidazolium bromide, 1-dodecyl-3-methylimidazolium chloride, 1-tetradecyl-3-methylimidazolium chloride, 1-ethyl-3-methylimidazolium tetrafluoroborate, 1-butyl-3-methylimidazolium tetrafluoroborate, 1-hexyl-3-methylimidazolium tetrafluoroborate, 1-ethyl-3-methylimidazolium hexafluorophosphate, 1-butyl-3-methylimidazolium hexafluorophosphate, 1-methyl-3-butylimidazolium methylsulfate, and 1,3-dibutylimidazolium methylsulfate. One of these may be used alone, or two or more may be used in combination.

Among these, [1-butyl-3-(2-hydroxyethyl)imidazolium bromide] and [1-butyl-3-(2-hydroxyethyl)imidazolium tetrafluoroborate] are preferred.

The ionic liquid has an electrical conductivity of preferably $10^{-7}$ S/cm or greater, and more preferably $10^{-6}$ S/cm or greater. If the electrical conductivity is within the range described above, as an electrical conduction auxiliary agent, the inorganic ionic compound can effectively suppress a reduction in electrical conductivity between the thermoelectric semiconductor particles.

Furthermore, the ionic liquid described above preferably has a decomposition temperature of 300° C. or higher. When the decomposition temperature is in the range described above, as described below, even in a case where a coating film (thin film) including the thermoelectric semiconductor composition is subjected to annealing, effect as the conductivity aid can be maintained.

In the present specification, the "decomposition temperature" refers to a temperature at which the mass loss rate at the firing (annealing) temperature as determined through thermogravimetry (TG) is 10%.

Furthermore, in the ionic liquid, the mass loss rate at 300° C. as determined through thermogravimetry (TG) is preferably 10% or less, more preferably 5% or less, and particularly preferably 1% or less. When the mass loss rate is in the range described above, even in a case where a coating film (thin film) including the thermoelectric semiconductor composition is subjected to a firing (annealing) treatment, effect as the conductivity aid can be maintained, as will be described below.

The content of the ionic liquid in the thermoelectric semiconductor composition is preferably from 0.01 to 50 mass %, more preferably from 0.5 to 30 mass %, and particularly preferably from 1.0 to 20 mass %. When the content of the ionic liquid is in the range described above, reduction of the electrical conductivity is effectively suppressed, and a film having a high thermoelectric performance can be obtained.

The content of the ionic liquid in the thermoelectric conversion material is preferably from 0.01 to 50 mass %, more preferably from 0.5 to 30 mass %, and particularly preferably from 1.0 to 20 mass %. When the content of the ionic liquid in the thermoelectric conversion material is in the range described above, reduction of the electrical conductivity is effectively suppressed, and a film having a high thermoelectric performance can be obtained.

Inorganic Ionic Compound

The inorganic ionic compound is a compound constituted from at least a cation and an anion. The inorganic ionic compound is a solid at room temperature, has a melting point at any temperature in a temperature range from 400 to 900° C., and exhibits high ionic conductivity, and therefore as an electrical conduction auxiliary agent, the inorganic ionic compound can suppress a reduction in electrical conductivity between the thermoelectric semiconductor particles.

When the thermoelectric semiconductor composition contains an inorganic ionic compound, a content of the inorganic ionic compound in the thermoelectric semiconductor composition is preferably from 0.01 to 50 mass %, more preferably from 0.5 to 30 mass %, and particularly preferably from 1.0 to 10 mass %. When the content of the inorganic ionic compound is in the range described above, reduction of the electrical conductivity is effectively suppressed and, as a result, a film having an improved thermoelectric performance can be obtained.

Note that, in a case where the inorganic ionic compound and the ionic liquid are used in combination, the total content of the inorganic ionic compound and the ionic liquid in the thermoelectric semiconductor composition is preferably from 0.01 to 50 mass %, more preferably from 0.5 to 30 mass %, and particularly preferably from 1.0 to 10 mass %.

The content of the inorganic ionic compound in the thermoelectric conversion material is preferably from 0.01 to 50 mass %, more preferably from 0.5 to 30 mass %, and particularly preferably from 1.0 to 10 mass %. When the content of the inorganic ionic compound in the thermoelectric conversion material is in the range described above, reduction of the electrical conductivity is effectively suppressed and, as a result, a film having an improved thermoelectric performance can be obtained.

Other Additives

The thermoelectric semiconductor composition may contain any other additive such as a dispersing agent, a film-forming aid, a light stabilizer, an antioxidant, a tackifier, a plasticizer, a colorant, a resin stabilizer, a filler, a pigment, an electrically conductive filler, an electrically conductive polymer, or a curing agent, as necessary, in addition to the materials described above. One of these may be used alone, or two or more may be used in combination.

Method for Manufacturing Thermoelectric Conversion Module

A method for manufacturing a thermoelectric conversion module according to the present invention includes the steps (i) to (vii) below:

(i) forming a coating film of a thermoelectric semiconductor composition on a substrate;

(ii) subjecting the coating film of the thermoelectric semiconductor composition obtained in the step (i) above to a firing (annealing) treatment to obtain a thermoelectric conversion material layer (chip) including a thermoelectric conversion material;

(iii) providing a first layer including a first resin film and a first electrode in this order;

(iv) providing a second A layer having a second resin film and a second electrode in this order, or a second B layer having a second resin film and having no electrode;

(v) joining one surface of the thermoelectric conversion material layer (chip) obtained in the step (ii) above to the electrode of the first layer provided in the step (iii) above via a first joining material layer;

(vi) removing the other surface of the thermoelectric conversion material layer (chip) after the step (v) above from the substrate; and (vii) joining the other surface of the thermoelectric conversion material layer (chip) obtained by removing in the step (vi) above to the electrode of the second A layer provided in the step (iv) above via a second joining material layer, or to the second B layer provided in the step (iv) above via a third joining material layer.

Method for Manufacturing Thermoelectric Conversion Material Layer (Chip)

First, a method for manufacturing a thermoelectric conversion material layer (chip) will be described in detail below.

The method for manufacturing a thermoelectric conversion material layer (chip) includes, for example;

(A) a step of forming a coating film of a thermoelectric semiconductor composition on a substrate;

(B) a step of subjecting the coating film of the thermoelectric semiconductor composition obtained in the step (A) above to a drying treatment;

(C) a step of removing the coating film of the thermoelectric semiconductor composition after drying obtained in (B) above from the substrate;

(D) a step of subjecting the coating film of the thermoelectric semiconductor composition obtained in (C) above to a heat-pressing treatment (heat-pressurization treatment); and (E) a step of subjecting the coating film of the thermoelectric semiconductor composition after pressing obtained in step (D) above to a firing (annealing) treatment.

Figure 3:
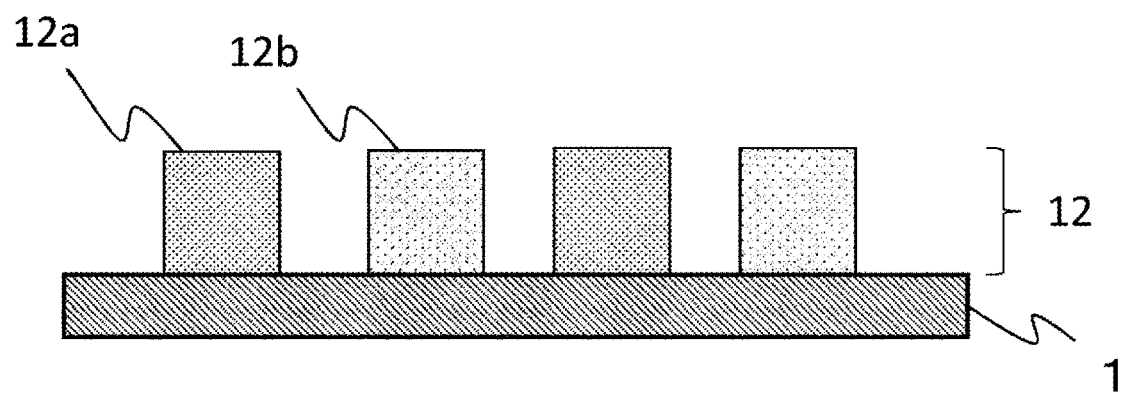
FIG. 3 is an explanatory diagram illustrating an example for a method for manufacturing a thermoelectric conversion material layer (chip) to be used to manufacture the thermoelectric conversion module of the present invention.

FIG. 3 is an explanatory diagram illustrating an example of the method for manufacturing a thermoelectric conversion material layer (chip) used to manufacture the thermoelectric conversion module of the present invention. A thermoelectric conversion material layer (chip) including a thermoelectric conversion material can be obtained as a self-supporting film by: forming a coating film 12 of a thermoelectric semiconductor composition on a substrate 1; then subjecting the coating film formed on the substrate to a drying treatment; removing the coating film from the substrate 1, and subjecting the coating film to a heat-pressing (heat-pressurization) treatment and then a firing (annealing) treatment.

Note that, in the method for manufacturing a thermoelectric conversion material layer (chip) described above, a case in which the thermoelectric conversion material layer (chip) is obtained as a self-supporting film is described. However, the thermoelectric conversion material layer (chip) is not formed as a self-supporting film, but formed on the substrate in the steps (i) to (v) above, removed from the substrate and formed as a self-supporting film in the step (vi).

(A) Step of Forming Coating Film of Thermoelectric Semiconductor Composition

The step of forming a coating film of a thermoelectric semiconductor composition is a step of forming a coating film of a thermoelectric semiconductor composition on a substrate 1, and for example, is a step of applying the coating film 12 including a thermoelectric semiconductor composition, that is, a coating film 12a including a thermoelectric semiconductor composition containing a P-type thermoelectric semiconductor material and a coating film 12b including a thermoelectric semiconductor composition containing an N-type thermoelectric semiconductor material, in FIG. 3.

The coating film 12a and the coating film 12b may be disposed in a manner with no particular limitation, but are preferably formed in such a manner that the coating films are connected by using electrodes to achieve a configuration for use in a π-type or in-plane type thermoelectric conversion module from the viewpoint of thermoelectric performance.

Here, in configuring a π-type thermoelectric conversion module, it is configured, for example, by: providing a pair of electrodes (electrodes 5 in FIG. 4 described later) separated from each other on a substrate (a resin film 4 in FIG. 4 described later); providing a fired body (P-type chip) of the coating film 12a including a thermoelectric semiconductor composition containing a P-type thermoelectric semiconductor material on one of the electrodes and a fired body (N-type chip) of the coating film 12b including a thermoelectric semiconductor composition containing an N-type thermoelectric semiconductor material on the other electrode in a state where they are similarly separated from each other; and electrically connecting upper surfaces of both the chips, in series, to the electrodes on the opposing substrates. From the perspective of efficiently obtaining a high thermoelectric performance, it is preferable to use a plurality of pairs of P-type chips and N-type chips via the electrodes on the opposing substrate in such a manner that they are electrically connected in series (see FIG. 4(f) described later).

Similarly, in configuring an in-plane thermoelectric conversion module, it is configured, for example, by providing one electrode on a substrate; providing a P-type chip on a surface of the electrode and similarly an N-type chip on the surface of the electrode in such a manner that side surfaces of the two chips (e.g., surfaces in a direction perpendicular to the substrate) are in contact with or separated from each other; and electrically connecting the chips in series via the electrode in an in-plane direction of the substrate. From the perspective of efficiently obtaining a high thermoelectric performance, it is preferable to use the same numbers of P-type chips and N-type chips in such a manner that they are alternately disposed via electrodes and electrically connected in series in the in-plane direction of the substrate.

Substrate

A material used for the substrate is not particularly limited, and examples thereof include glass, silicon, ceramic, metal, and plastic. One of these may be used alone, or two or more may be used in combination.

Among them, from the perspective of performing the firing (annealing) treatment, glass, silicon, ceramic, and metals are preferred. From the perspectives of adhesion to the thermoelectric conversion material, raw material cost, and dimensional stability after the heat treatment, use of glass, silicon, or ceramic is more preferred.

A thickness of the substrate may be from 100 to 10000 μm from the viewpoint of process and dimensional stability.

Method for Preparing Thermoelectric Semiconductor Composition

A method for preparing a thermoelectric semiconductor composition is not particularly limited, and the thermoelectric semiconductor composition may be prepared by using a known method, such as an ultrasonic homogenizer, a spiral mixer, a planetary mixer, a disperser, or a hybrid mixer, and by adding thermoelectric semiconductor particles, and further a binder resin, one or both of an ionic liquid and an inorganic ionic compound, any other additive, as well as a solvent, as needed, and mixing and dispersing them.

Note that the thermoelectric semiconductor particles, binder resin, ionic liquid, inorganic ionic compound, and any other additive are as described above.

Examples of the solvent include toluene, ethyl acetate, methyl ethyl ketone, alcohol, tetrahydrofuran, N-methyl pyrrolidone, and ethyl cellosolve. One of these may be used alone, or two or more may be used in combination. As the solid content concentration of the thermoelectric semiconductor composition, the composition is only required to have a viscosity adequate for application, and the solid content concentration is not particularly limited.

The coating film (thin film) including the thermoelectric semiconductor composition can be formed by applying, and drying, the thermoelectric semiconductor composition on the substrate.

A method for applying the thermoelectric semiconductor composition onto the substrate is not particularly limited, and examples thereof include well-known methods such as screen printing, flexographic printing, gravure printing, spin coating, dip coating, die coating, spray coating, bar coating, and doctor blade coating. When the coating film is formed in a pattern, a method such as screen printing, stencil printing, or slot die coating by which the pattern can be easily formed using a screen plate having the desired pattern is preferably used.

(B) Drying Treatment Step

The drying treatment step is a step of drying the coating film (thin film) of the thermoelectric semiconductor composition formed on the substrate in a state where the coating film of the thermoelectric semiconductor composition has the substrate at a predetermined temperature.

Next, the obtained coating film is dried, and thus the coating film (thin film) is formed. As the drying method, a well-known drying method can be used, such as hot air drying, heated roll drying, and infrared irradiation. The heating temperature is typically from 80 to 150° C., and while the heating time differs depending on the heating method, the heating time is typically from tens of seconds to tens of minutes.

Furthermore, when a solvent is used in the preparation of the thermoelectric semiconductor composition, the heating temperature is not particularly limited as long as the temperature is within a temperature range in which the solvent that is used can be dried.

The thickness of the coating film (thin film) including the thermoelectric semiconductor composition is not particularly limited, but from the perspective of thermoelectric performance and film strength, the thickness of the thin film is preferably from 100 nm to 1000 μm, more preferably from 300 nm to 600 μm, and particularly preferably from 5 to 400 μm.

(C) Coating Film Removing Step

The coating film removing step is a step of removing the coating film (thin film) including the thermoelectric semiconductor composition from the substrate after the drying treatment.

A method for removing the coating film is not particularly limited as long as the method is capable of removing the coating film (thin film) from the substrate after the drying treatment, and a plurality of coating films (thin films) may be removed from the substrate in the form of an individual piece, or may be collectively removed in the form of a plurality of coating films (thin films).

(D) Heat-Pressing (Heat-Pressurization) Treatment Step

The heat-pressing (heat-pressurization) treatment step is a step of subjecting the coating film (thin film) of the thermoelectric semiconductor composition removed from the substrate to a heat-pressing (heat-pressurization) treatment.

The heat-pressing (heat-pressurization) treatment is a treatment for pressurizing the entire upper surface of the coating film (thin film), for example, using an apparatus such as a hydraulic press machine, at a predetermined temperature, in an atmosphere, at a predetermined pressure, for a predetermined time.

The temperature for the heat-pressing (heat-pressurization) treatment is not particularly limited, but is usually from 100 to 300° C., and preferably for 200 to 300° C.

The pressure for the heat-pressing (heat-pressurization) treatment is not particularly limited, but is usually from 20 to 200 MPa, and preferably from 50 to 150 MPa.

The time for the heat-pressing (heat-pressurization) treatment is not particularly limited, but is usually several seconds to several tens of minutes, and preferably several tens of seconds to over ten minutes.

(E) Firing (Annealing) Treatment Step

The firing (annealing) treatment step is a step of subjecting the coating film (thin film) of the thermoelectric semiconductor composition to a heat treatment at a predetermined temperature following a heat-pressing (heat-pressurization) treatment.

By performing the firing (annealing) treatment, the thermoelectric performance can be stabilized, making the thermoelectric semiconductor particles in the thermoelectric semiconductor composition in the coating film (thin film) be crystal-grown, thereby further improving the thermoelectric performance of the thermoelectric conversion material layer.

The firing (annealing) treatment is not particularly limited, but is usually performed in an inert gas atmosphere such as nitrogen or argon, or in a reducing gas atmosphere with a gas flow rate being controlled, or under vacuum conditions.

The temperature for the firing (annealing) treatment depends on the thermoelectric semiconductor particles, the binder resin, the ionic liquid, the inorganic ionic compound, and the like used in the thermoelectric semiconductor composition, and is typically adjusted, but is usually from 260 to 600° C., and preferably from 280 to 550° C.

The time for the firing (annealing) treatment is not particularly limited, but is usually several minutes to several tens of hours, and preferably several minutes to several hours.

According to the method for manufacturing a thermoelectric conversion module described above, the thermoelectric conversion material layer (chip) can be manufactured in a simple manner. Furthermore, the firing (annealing) treatment is not performed in a state where the coating film (thin film) of the thermoelectric semiconductor composition and the electrode are joined, and thus the issues of increase in electrical resistance value between the thermoelectric conversion material layer (chip) and the electrode, reduction in thermoelectric performance, etc. do not occur.

In the method for manufacturing a thermoelectric conversion module described above, the thermoelectric conversion module is manufactured by using the thermoelectric conversion material layer (chip) obtained through the steps (i) and (ii) above. Here, the step (i) above corresponds to (A) the step of forming a coating film of a thermoelectric semiconductor composition in the method for manufacturing a thermoelectric conversion material layer (chip), and the step (ii) above corresponds to (E) the firing (annealing) treatment step in the method for manufacturing the thermoelectric conversion material layer (chip). In addition, through the step (i), for example, an embodiment as described in FIG. 3 is indicated. In addition, the substrate, coating film (thin film) of the thermoelectric semiconductor composition, preferred materials that constitute them, thicknesses, forming methods, and the like to be used are all the same as those described above.

In the method for manufacturing a thermoelectric conversion module described above, the step (iv) above is preferably a step of providing a second A layer having a second resin film and a second electrode in this order, and the step (vii) above is preferably a step of joining the other surface of the chip of the thermoelectric conversion material obtained by removing in the step (vi) above to the second electrode of the second A layer provided in the step (iv) above via a second joining material layer, from the perspective of thermoelectric performance.

The thermoelectric conversion module obtained through the steps corresponds to the π-type thermoelectric conversion module described above.

Additionally, in another example of the method for manufacturing a thermoelectric conversion module, the step (iv) above is preferably a step of providing a second B layer having a second resin film and having no electrode, and the step (vii) above is preferably a step of joining the other surface of the chip of the thermoelectric conversion material obtained by removing in (vi) above to the second B layer provided in the step (iv) above via a third joining material layer, from the perspective of thermoelectric performance.

The thermoelectric conversion module obtained through the above-described steps corresponds to the in-plane type electric thermoelectric conversion module described above.

The method for manufacturing a thermoelectric conversion module will be described below using the drawings.

Figure 4:
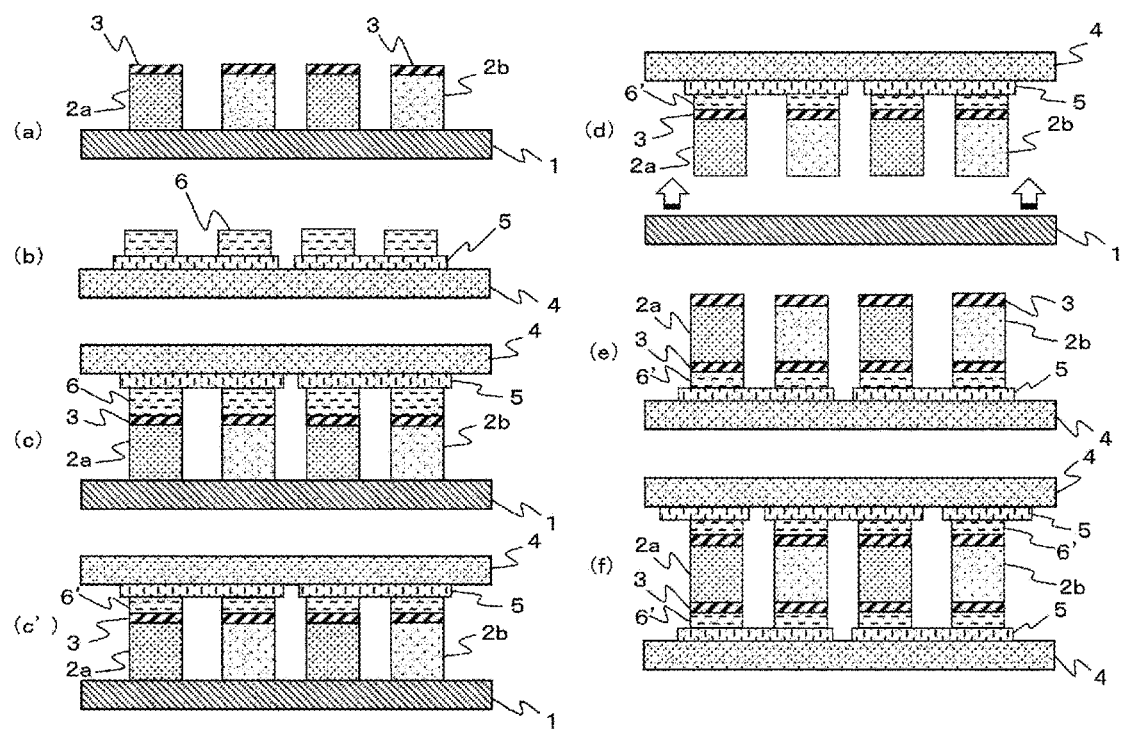
FIG. 4 is diagrams illustrating an example for a method for manufacturing a thermoelectric conversion module of the present invention.

FIG. 4 includes diagrams illustrating an example of the method for manufacturing a thermoelectric conversion module of the present invention (method for manufacturing a π-type thermoelectric conversion module). FIG. 4(a) is a cross-sectional view after forming a solder receiving layer, described later, on one surface (upper surface) of the thermoelectric conversion material layer (chip); FIG. 4(b) is a cross-sectional view after forming an electrode and a solder material layer on the resin film; FIG. 4(c) is a cross-sectional view after bonding the electrode on the resin film obtained in FIG. 4(b) and one surface (upper surface) of the thermoelectric conversion material layer (chip) via the solder receiving layer in FIG. 4(a); FIG. 4(c') is a cross-sectional view after joining the solder material layer by heating and cooling; FIG. 4(d) is a cross-sectional view after removing the other surface (lower surface) of the thermoelectric conversion material layer (chip) from the substrate; FIG. 4(e) is a cross-sectional view after forming a solder receiving layer on the other surface (lower surface) of the thermoelectric conversion material layer (chip) on the resin film, obtained in FIG. 4(d); and FIG. 4(f) is a cross-sectional view after bonding and joining the electrode on the resin film obtained in FIG. 4(b) to the other surface (lower surface) of the thermoelectric conversion material layer (chip) via the solder material layer and the solder receiving layer in FIG. 4(e).

Electrode Formation Step

The electrode formation step is a step of forming a first electrode on a first resin film in the step (iii) above of providing a first layer having the first resin film and the first electrode in this order, in the method for manufacturing a thermoelectric conversion module. Or, the electrode formation step is a step of forming a second electrode on a second resin film in the step (iv) above of providing a second A layer having the second resin film and the second electrode. In FIG. 4(b), for example, this step if a step of forming a metal layer on the resin film 4, processing them into a predetermined pattern, and forming the electrode 5.

Resin Film

The first resin film and the second resin film may be of the same or different material. Of these, from the perspectives of excelling in bendability, being able to maintain performance of the thermoelectric device without thermal deformation of the substrate even when the coating film (thin film) including the thermoelectric semiconductor composition is subjected to the firing (annealing) treatment, and having high heat resistance and dimensional stability, the resin films are preferably polyimide films, polyamide films, polyetherimide films, polyaramide films, or polyamide-imide films. From the perspective of high versatility, the resin films are particularly preferably polyimide films.

From the perspectives of bendability, heat resistance, and dimensional stability, the first resin film and the second resin film independently have a thickness of preferably from 1 to 1000 µm, more preferably from 5 to 500 µm, and particularly preferably from 10 to 100 µm.

Also, in the first resin film and the second resin film, a 5% mass loss temperature as determined through thermogravimetric analysis (TG) is preferably 300° C. or higher, and more preferably 400° C. or higher. A dimensional change rate due to heating as measured at 200° C. in accordance with JIS K7133 (1999) is preferably 0.5% or less, and more preferably 0.3% or less. A linear expansion coefficient in the planar direction as measured in accordance with JIS K7197 (2012) is from 0.1 to 50 ppm·° $C.^{-1}$, and is more preferably from 0.1 to 30 ppm·° $C.^{-1}$.

Electrode

Metal materials for the first electrode and the second electrode of the thermoelectric conversion module are, for example, each independently copper, gold, nickel, aluminum, rhodium, platinum, chromium, palladium, stainless steel, molybdenum, or an alloy containing any of these metals. One of these may be used alone, or two or more may be used in combination.

The thicknesses of the respective layers of the electrodes (metal materials) are preferably from 10 nm to 200 µm, more preferably from 30 nm to 150 µm, and particularly preferably from 50 nm to 120 µm. If the thicknesses of the respective layers of the electrodes (metal materials) are within the range described above, electrical conductivity is high, resistance is low, and sufficient strength of an electrode is obtained.

The electrodes are formed using the metal materials described above.

A method for forming the electrodes is, for example, a method in which an electrode having no pattern formed thereon is provided on a resin film, and processed into a predetermined pattern shape by a known physical treatment or chemical treatment mainly using a photolithography method, or a method in which a pattern of an electrode is directly formed by screen printing, an inkjet method, or the like.

Examples of methods for forming an electrode having no pattern formed thereon include dry processes including physical vapor deposition (PVD) methods, such as vacuum vapor deposition, sputtering, and ion plating or chemical vapor deposition (CVD) methods, such as thermal CVD and atomic layer deposition (ALD); wet processes including various coating methods, such as dip coating, spin coating, spray coating, gravure coating, die coating, and doctor blade coating, and electrodeposition methods; silver salt methods; electrolytic plating; electroless plating; and lamination of metal foils. The method is appropriately selected according to the material for the electrode.

From the perspective of maintaining thermoelectric performance, the electrodes are required to exhibit high electrical conductivity and high thermal conductivity, and therefore use of an electrode that has been film formed by plating or a vacuum film formation method is preferable. Since high electrical conductivity and high thermal conductivity can be easily achieved, a vacuum film formation method such as vacuum vapor deposition or a sputtering method; electrolytic plating; electroless plating; or the like is preferred. A pattern can be easily formed through a hard mask such as a metal mask depending on the dimensions of the pattern to be formed and the required dimensional accuracy.

First Electrode Joining Step

A first joining step is the step (v) above of the method for manufacturing a thermoelectric conversion module, which is a step of joining one surface of the thermoelectric conversion material layer (chip) obtained in the step (ii) above and the first electrode of the first layer provided in the step (iii) above via the first joining material layer.

The first electrode joining step is, for example, a step of interposing a solder material layer 6 on the electrode 5 of the resin film 4 and a solder receiving layer 3 formed on one surface of each of a thermoelectric conversion material layer (P-type chip) 2a including a P-type thermoelectric conversion material and a thermoelectric conversion material layer (N-type chip) 2b including an N-type thermoelectric conversion material; bonding the P-type chip 2a and the N-type chip 2b to the electrode 5; heating the solder material layer 6 to a predetermined temperature, retaining it for a predetermined time; then returning it to room temperature; and thus joining the P-type chip 2a and the N-type chip 2b to the electrode 5, in FIG. 4(c). A heating temperature, a retention time, and the like are as will be described above. Note that FIG. 4(c') illustrates an aspect after the solder material layer 6 is returned to room temperature (a solder material layer 6' is solidified by heating and cooling, and has a reduced thickness).

First Joining Material Layer Formation Step

The first electrode joining step includes a first joining material layer formation step.

The first joining material layer formation step is a step of forming a first joining material layer on the first electrode obtained in the step (iii) above, in the step (v) above of the method for manufacturing a thermoelectric conversion module.

The first joining material layer formation step is, for example, a step of forming the solder material layer 6 on the electrode 5 in FIG. 4(b).

Examples of the joining material constituting the first joining material layer include a solder material, an electrically conductive adhesive, and a sinter joining agent, and these materials are preferably formed as a solder material layer, an electrically conductive adhesive layer, and a sinter joining agent layer on the electrode. In the present specification, electrical conductivity means that the electrical resistivity is less than $1\times10^6$ Ω·m.

Examples of the solder material constituting the solder material layer include known materials such as Sn, Sn/Pb alloys, Sn/Ag alloys, Sn/Cu alloys, Sn/Sb alloys, Sn/In alloys, Sn/Zn alloys, Sn/In/Bi alloys, Sn/In/Bi/Zn alloys, Sn/Bi/Pb/Cd alloys, Sn/Bi/Pb alloys, Sn/Bi/Cd alloys, Bi/Pb alloys, Sn/Bi/Zn alloys, Sn/Bi alloys, Sn/Bi/Pb alloys, Sn/Pb/Cd alloys, and Sn/Cd alloys. One of these may be used alone, or two or more may be used in combination.

Among these, an alloy such as a 43Sn/57Bi alloy, a 42Sn/58Bi alloy, a 40Sn/56Bi/4Zn alloy, a 48Sn/52In alloy, or a 39.8Sn/52In/7Bi/1.2Zn alloy is preferred from the perspective of lead-free and/or cadmium-free, melting point, electrical conductivity, and thermal conductivity.

Examples of commercially available solder material products that can be used include the following. For example, a 42Sn/58Bi alloy (available from Tamura Corporation, product name: SAM10-401-27), a 41Sn/58Bi/Ag alloy (available from Nihon Handa Inc., product name: PF141-LT7HO), a 96.5Sn3Ag0.5Cu alloy (available from Nihon Handa Inc., product name: PF305-207BTO), and the like can be used.

The thickness (after heating and cooling) of the solder material layer is preferably from 10 to 200 μm, more preferably from 20 to 150 μm, even more preferably from 30 to 130 μm, and particularly preferably from 40 to 120 μm. When the thickness of the solder material layer is within this range, adhesion of the chip of the thermoelectric conversion material to the electrode is facilitated.

Examples of the method of coating a substrate with the solder material include known methods such as stencil printing, screen printing, and dispensing methods. The heating conditions vary based on, for example, the solder material and the resin film, but heating is typically performed at from 150 to 280° C. for from 3 to 20 minutes.

In a case where a solder material layer is used, from the perspective of improving adhesion to the chip of the thermoelectric conversion material, joining is preferably performed by interposing a solder receiving layer.

The electrically conductive adhesive constituting the electrically conductive adhesive layer is not particularly limited, and examples thereof include an electrically conductive paste and a binder. One of these may be used alone, or two or more may be used in combination.

Examples of the electrically conductive paste include copper paste, silver paste, and nickel paste. One of these may be used alone, or two or more may be used in combination.

Examples of the binder include epoxy resins, acrylic resins, and urethane resins. One of these may be used alone, or two or more may be used in combination.

Examples of a method for applying the electrically conductive adhesive onto the resin film include known methods such as screen printing and dispensing methods. One of these may be used alone, or two or more may be used in combination.

A thickness of the electrically conductive adhesive is preferably from 10 to 200 μm, more preferably from 20 to 150 μm, further preferably from 30 to 130 μm, and particularly preferably from 40 to 120 μm.

The sinter joining agent constituting the sinter joining agent layer are not particularly limited, and examples thereof include a sintering paste.

The sintering paste includes, for example, micron-sized metal powder and nano-sized metal particles, and unlike the electrically conductive adhesive, the sintering paste is used to directly join a metal through sintering, and may include a resin such as an epoxy resin, an acrylic resin, or a urethane resin.

Examples of the sintering paste include silver sintering pastes and copper sintering pastes. One of these may be used alone, or two or more may be used in combination.

Examples of a method for applying a sinter joining agent onto the resin film include known methods such as screen printing, stencil printing, and dispensing methods. One of these may be used alone, or two or more may be used in combination.

The sintering conditions differ depending on factors such as the metal materials that are used, but usually include sintering at 100 to 300° C. for 30 to 120 minutes.

Examples of commercially available sinter joining agents that can be used include silver sintering pastes such as CT2700R7S sintering paste (available from Kyocera Corporation), and the sintering-type metal joining material MAX102 (available from Nihon Handa Inc.).

A thickness of the sinter joining agent layer is preferably from 10 to 200 μm, more preferably from 20 to 150 μm, even more preferably from 30 to 130 μm, and particularly preferably from 40 to 120 μm.

Solder Receiving Layer Formation Step

For example, when a π-type thermoelectric conversion module or an in-plane thermoelectric conversion module is manufactured, the method for manufacturing a thermoelectric conversion module preferably includes a step of forming a solder receiving layer on one surface of the chip of the thermoelectric conversion material after the firing (annealing) treatment obtained in the step (ii) above.

The solder receiving layer formation step is a step of forming a solder receiving layer on a thermoelectric conversion material layer (chip) including a thermoelectric conversion material, and for example, and is a step of forming the solder receiving layer 3 on one surface of the thermoelectric conversion material layer (P-type chip) 2a including a P-type thermoelectric conversion material and the thermoelectric conversion material layer (N-type chip) 2b including an N-type thermoelectric conversion material, in FIG. 4(a).

The solder receiving layer preferably contains a metal material. The metal material is preferably at least one type selected from the group consisting of gold, silver, aluminum, rhodium, platinum, chromium, palladium, tin, and alloys containing these metal materials. Among these, the metal material is preferably gold, silver, aluminum, or a two-layer structure of tin and gold; and from the perspectives of material cost, high thermal conductivity, and joining stability, silver and aluminum are more preferred.

Furthermore, in addition to the metal material, the solder receiving layer may be formed using a paste material containing a solvent or a resin component. When the paste material is used, the solvent or resin component is preferably removed by firing and the like as will be described below. The paste material is preferably silver paste or aluminum paste.

A thickness of the solder receiving layer is preferably from 10 nm to 50 μm, more preferably from 50 nm to 16 μm, further preferably from 200 nm to 4 μm, and particularly preferably from 500 nm to 3 μm. When the thickness of the solder receiving layer is within this range, the adhesion thereof to the surface of the thermoelectric conversion material layer (chip) including the thermoelectric conversion material, and the adhesion thereof to the surface of the solder material layer on the electrode side are excellent, and reliable joining can be obtained. In addition, since not only electrical conductivity but also thermal conductivity can be maintained high, the thermoelectric performance as a thermoelectric conversion module is not deteriorated and is maintained, as a result.

The solder receiving layer may be used as a single layer by depositing a metal material as it is, or may be used as a multilayer by laminating two or more metal materials. In addition, a composition having a metal material contained in a solvent, a resin or the like may be used to form the solder receiving layer. However, in this case, from the viewpoint of maintaining high electrical conductivity and high thermal conductivity (maintaining thermoelectric performance), as the final form of the solder receiving layer, the resin component including the solvent is preferably removed by firing or the like.

The solder receiving layer is formed using the metal material described above.

Examples of a method for forming the solder receiving layer include a method in which a solder receiving layer having no pattern formed thereon is provided on the thermoelectric conversion material layer (chip), and processed into a predetermined pattern shape by a known physical treatment or chemical treatment mainly using a photolithography method or using a combination thereof, or a method in which a pattern of the solder receiving layer is directly formed by screen printing, stencil printing, an inkjet method, or the like.

Examples of methods for forming a solder receiving layer having no pattern formed thereon include physical vapor deposition (PVD) methods, such as vacuum vapor deposition, sputtering, and ion plating; chemical vapor deposition (CVD) methods, such as thermal CVD and atomic layer deposition (ALD); various coating methods including dip coating, spin coating, spray coating, gravure coating, die coating, and doctor blade coating; wet processes such as electrodeposition methods, silver salt methods, electrolytic plating, electroless plating, and lamination of metal foils. The method is appropriately selected according to the material for the solder receiving layer.

From the perspective of maintaining thermoelectric performance, the solder receiving layer is required to exhibit high electrical conductivity and high thermal conductivity, and therefore use of a solder receiving layer that has been formed by screen printing, stencil printing, electrolytic plating, electroless plating, or a vacuum film formation method is preferable.

Chip Collective Removing Step

A chip collective removing step is the step (vi) above of the method for manufacturing a thermoelectric conversion module, which is a step of removing the other surface of the thermoelectric conversion material layer (chip) after the step (v) above from the substrate.

The chip collective removing step is, for example, a step of collectively removing the other surfaces of the thermoelectric conversion material layer (P-type chip) 2a including a P-type thermoelectric conversion material and the thermoelectric conversion material layer (N-type chip) 2b including an N-type thermoelectric conversion material from the substrate 1, in FIG. 4(d).

A method for removing the thermoelectric conversion material layers is not particularly limited as long as it is capable of collectively removing all the thermoelectric conversion material layers (chips) from the substrate.

Second Electrode Joining Step

A second joining step is the step (vii) above of the method for manufacturing a thermoelectric conversion module, which is a step of joining the other surface of the thermoelectric conversion material layer (chip) obtained by removing in the step (vi) above to the second electrode of the second A layer provided in the step (iv) above via the second joining material layer.

The second electrode joining step is, for example, a step of joining the other surfaces of the thermoelectric conversion material layer (P-type chip) 2a including a P-type thermoelectric conversion material and the thermoelectric conversion material layer (N-type chip) 2b including an N-type thermoelectric conversion material to the electrode 5 on the resin film 4 via the solder receiving layer 3 and the solder material layer 6, in FIG. 4(f).

The same materials as those described for the first electrode joining step can be used as materials for both the second electrode and the second resin film in the second A layer, and the joining method is also the same.

The joining to the electrode is preferably performed via the aforementioned solder material layer, electrically conductive adhesive layer, or sinter joining agent layer.

Second Joining Material Layer Formation Step

The second electrode joining step includes a second joining material layer formation step.

The second joining material layer formation step is a step of forming a second joining material layer on the second electrode of the second A layer provided in the step (iv) above, in the step (vii) above of the method for manufacturing a thermoelectric conversion module.

The second joining material layer can be formed from the same material as that for the first joining material layer described above, and the same applies to the formation method, thickness, and the like.

In addition, for example, when a solder material layer is used when a π-type thermoelectric conversion module is manufactured, the method preferably further includes a step of forming a solder receiving layer on the other surface of the thermoelectric conversion material layer (chip) obtained by removing in the step (vi) above.

This step is, for example, a step of forming the solder receiving layer 3 on the other surfaces of the thermoelectric conversion material layer (P-type chip) 2a including a P-type thermoelectric conversion material and the thermoelectric conversion material layer (N-type chip) 2b including an N-type thermoelectric conversion material, in FIG. 4(e).

Note that a combination of the respective joining material layers used in the electrodes on the pair of resin films in the thermoelectric conversion module (except for a case where there is no electrode on either one of the pair of resin films) is not particularly limited, but is preferable to use a combination of the solder material layers, the electrically conductive adhesive layers, or the sinter joining agent layers from the perspective of preventing mechanical deformation of the thermoelectric conversion module and suppressing a reduction in thermoelectric performance.

Resin Film Joining Step

The resin film joining step is included in the step (vii) above of the method for manufacturing a thermoelectric conversion module, and is a step of joining the other surface of the thermoelectric conversion material layer (chip) obtained by removing in the step (vi) above, and the second B layer having the second resin film and having no electrode provided in the step (iv) above via a third joining material layer. The second resin film is as described previously. For the joining with the second layer of B layer having the second resin film and having no electrode, the third joining material layer is used.

A joining material constituting the third joining material layer is preferably a resin material, and is formed on the resin film as a resin material layer.

The resin material preferably includes a polyolefin resin, an epoxy-based resin, or an acrylic resin. Furthermore, the resin material preferably has adhesive properties and low water vapor permeability. In the present specification, "having adhesive properties" means that the resin material has pressure sensitive adhesion, adhesion, and pressure-sensitive adhesion that enables adhesion through pressure sensitivity in an early stage of pasting.

The resin material layer can be formed by a known method.

A thickness of the resin material layer is preferably from 1 to 100 µm, more preferably from 3 to 50 µm, and particularly preferably from 5 to 30 µm.

Another Method for Manufacturing Thermoelectric Conversion Module

As another example of the method for manufacturing a thermoelectric conversion module, the following method is indicated.

Specifically, the method is a method for forming a thermoelectric conversion module by removing a plurality of chips one by one from the substrate described above to obtain the chips, and placing the chips one by one on a predetermined electrode on the resin film.

As a method for disposing a plurality of chips on the electrode, a known method can be used, for example, in which a plurality of chips are individually handled by a robot arm or the like, positioned by a microscope or the like, and disposed.

According to the method for manufacturing a thermoelectric conversion module described above, a chip can be formed in a simple manner, and in a case of a thermoelectric conversion module in which a plurality of chips are combined, it is possible to prevent deterioration in thermoelectric performance resulting from formation of an alloy layer due to diffusion between the thermoelectric semiconductor composition and the electrodes in a known firing (annealing) treatment step.

EXAMPLES

The present invention will now be described in greater detail by way of examples, but the present invention is not limited by these examples.

In a test piece (chip) including a thermoelectric conversion material, which was produced in each of Examples and Comparative Examples, (a) measurement of a filling ratio in a longitudinal cross-section along a thickness direction and (b) evaluation of electrical properties (measurement of an electrical resistance value) were performed by the following methods.

Figure 5:
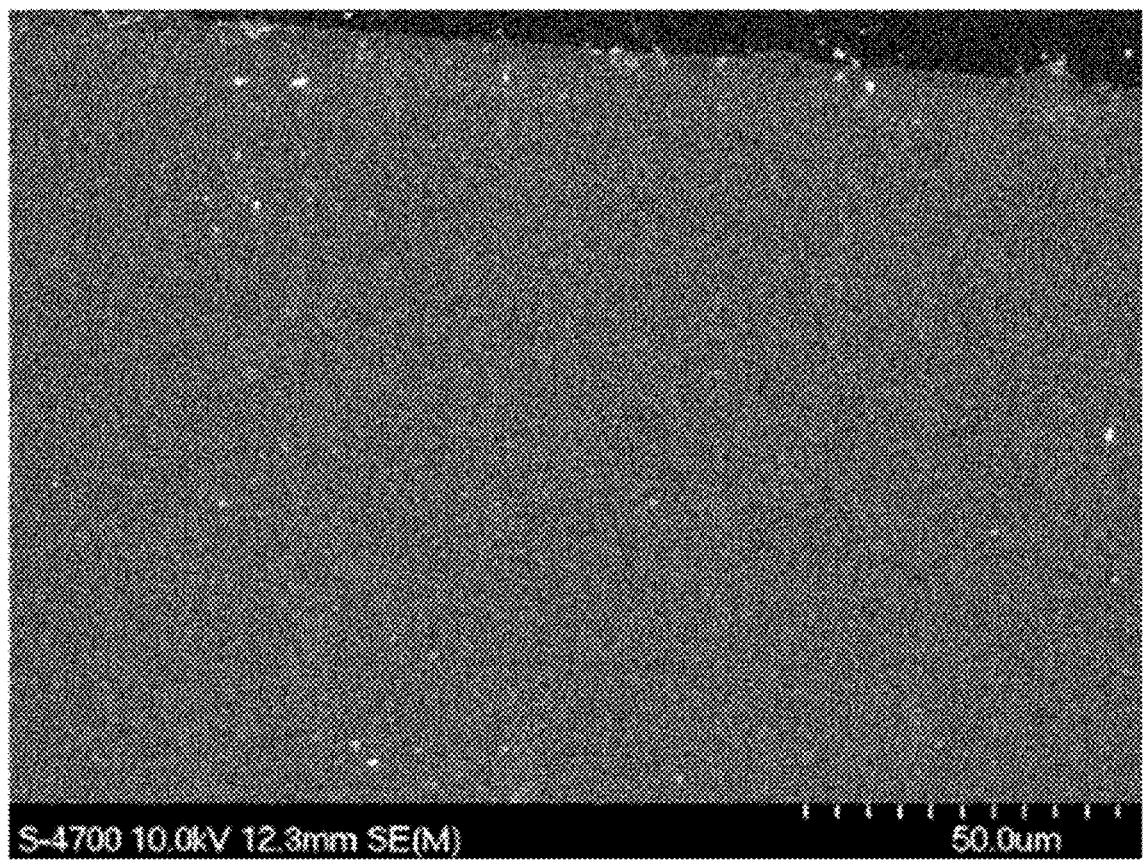
FIG. 5 is an SEM image of the longitudinal cross-section of a test piece (thermoelectric conversion material layer) of Example 1.
Figure 6:
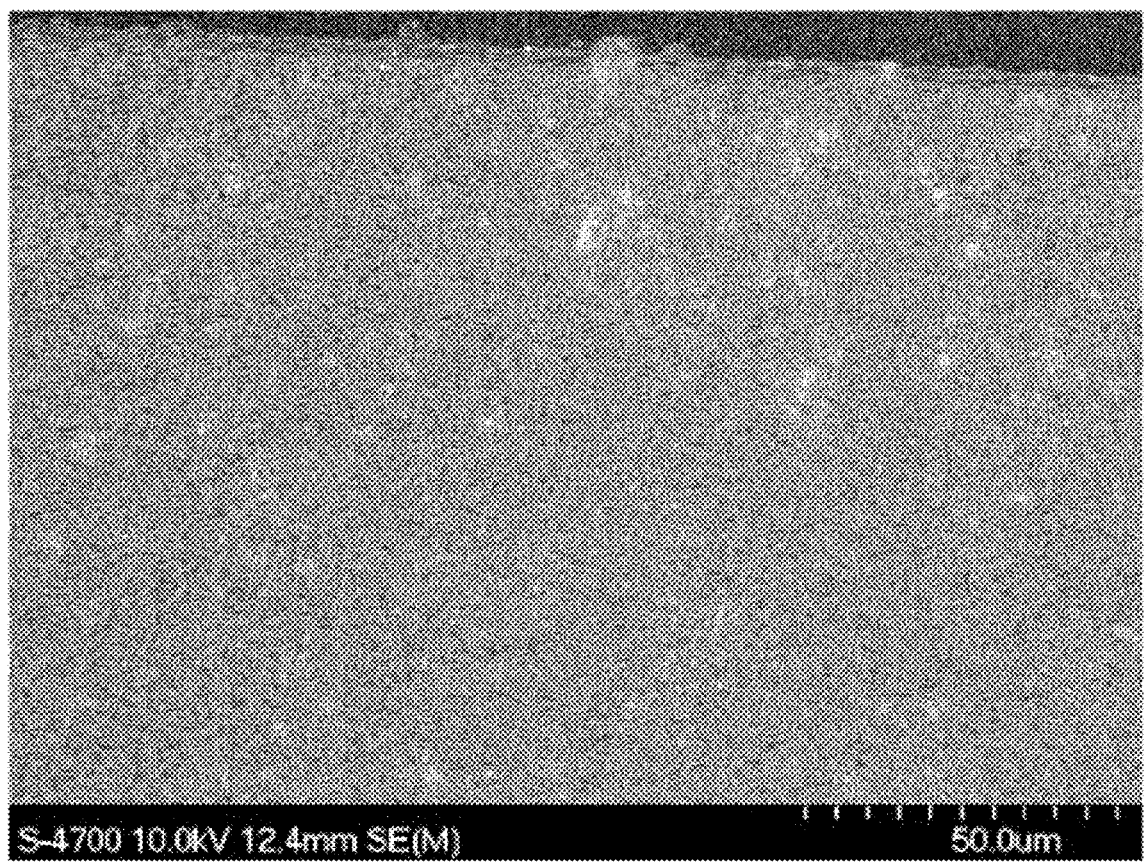
FIG. 6 is an SEM image of the longitudinal cross-section of a test piece (thermoelectric conversion material layer) of Comparative Example 1.

(a) Measurement of Filling Ratio in Longitudinal Cross-Section Along Thickness Direction For the test piece (chip) including a thermoelectric conversion material, which was obtained in each of the Examples and the Comparative Examples, a longitudinal cross-section including the center portion of the thermoelectric conversion material layer was exposed by a polishing apparatus (available from Refine Tech Ltd., model name: Refine Polisher HV); the longitudinal cross-section was observed using a scanning electron microscope (SEM) (available from KEYENCE CORPORATION); and then image processing software (available from National Institutes of Health, ImageJ ver. 1.44 P) was used to calculate a filling ratio defined as a proportion of an area occupied by the thermoelectric conversion material within an area of the longitudinal cross-section of the thermoelectric conversion material layer (Example 1: FIG. 5, and Comparative Example 1: FIG. 6).

In the measurement of the filling ratio, using an SEM image with the magnification of 500 times (longitudinal cross-section), the measurement range was trimmed, as an image, for a range surrounded by 1280 pixel in the width direction and 220 pixel in the thickness direction with respect to any position of the thermoelectric conversion material layer. The trimmed image was subjected to binarization processing by maximizing the contrast by "Brightness/Contrast" and, taking the dark part obtained by the binarization processing as the void part and taking the light part as the thermoelectric conversion material, the filling ratio of the thermoelectric conversion material was calculated by "Threshold". The filling ratio was calculated for three SEM images, and an average value thereof was used. The results are shown in Table 1.

(b) Evaluation of Electrical Properties (Measurement of Electrical Resistance Value)

For the test piece (chip) (bottom surface: square with each side of 1.2 mm/thickness: 200 µm) including a thermoelectric conversion material, which was obtained in each of the Examples and the Comparative Examples, the electrical resistance value (mΩ) was measured through 4-terminal measurement using a low resistance meter (RM3545 available from HIOKI E.E. Corporation), and the electrical resistivity (Ω·m) was calculated. The results are shown in Table 1.

Example 1

Production of Test Piece (Chip) Including Thermoelectric Conversion Material (1) Preparation of Thermoelectric Semiconductor Composition Preparation of Thermoelectric Semiconductor Particle P-type bismuth telluride $Bi_{0.4}Te_{3.0}Sb_{1.6}$, which is a bismuth-tellurium-based thermoelectric semiconductor material, (available from Kojundo Chemical Lab. Co., Ltd.; particle size: 20 µm) was pulverized in a nitrogen gas atmosphere by using a planetary ball mill (Premium line P-7, available from Fritsch Japan Co., Ltd.), and thus thermoelectric semiconductor particles having an average particle size of 2.5 µm were prepared. The thermoelectric semiconductor particles obtained by pulverization were subjected to particle size distribution measurement using a laser diffraction particle size analyzer (Mastersizer 3000 available from Malvern Panalytical Ltd.).

Preparation of Thermoelectric Semiconductor Composition

A thermoelectric semiconductor composition was prepared by mixing and dispersing 77.0 parts by mass of the obtained P-type bismuth telluride $Bi_{0.4}Te_{3.0}Sb_{1.6}$ particles (average particle size: 2.5 µm), 16.5 parts by mass of a polyethylene carbonate solution (QPAC 25 available from Empower Materials, Inc., solvent: N-methylpyrrolidone, solid content concentration: 20 mass %) containing polyethylene carbonate (final decomposition temperature: 250° C.) as a binder resin (solid content: 3.3 parts by mass), and 6.5 parts by mass of 1-butylpyridinium bromide (IL-P18B available from KOEI CHEMICAL COMPANY, LTD.) as an ionic liquid.

(2) Production of Test Piece (Chip) Including Thermoelectric Conversion Material (Formation of Thermoelectric Conversion Material Layer)

For formation of a coating film of the thermoelectric semiconductor composition, a coating film (thin film) of the thermoelectric semiconductor composition was produced by disposing a metal mask (material: magnetic SUS, thickness: 50 µm) formed with an opening in a pattern, flow-casting the thermoelectric semiconductor composition prepared in (1) above on the metal mask, and removing the materials other than the thermoelectric semiconductor composition filled in the opening by a metal squeegee, and performing heat-drying at 120° C. for 10 minutes. As the metal mask, a metal mask having an opening of 1.95 mm×1.95 mm and a thickness from 450 to 550 μm in accordance with the shape of a coating film to be produced was used. After heat-drying, the coating film (thin film) was removed from the metal mask, the coating film (thin film) was further peeled from the Kapton film, and a heat-pressurization treatment was performed. This heat-pressurization treatment involved a pressurization treatment performed on the entire upper surface of the coating film (thin film), using a hydraulic press machine (available from Tester Sangyo Co., ltd., tabletop test press SA-302), at 250° C., in an atmospheric atmosphere, at 110 MPa, for 10 minutes. Furthermore, to prevent deformation of the coating film obtained by such a pressurization treatment, a frame having openings corresponding to the target shape was disposed in such a manner that the coating film was surrounded by the frame, and then the coating film (thin film) was pressurized.

The temperature of the coating film obtained by the pressurization treatment was increased at a warming rate of 5 K/min in a hydrogen-argon mixed gas (hydrogen:argon=3 vol %:97 vol %) atmosphere. The coating film was retained at a firing (annealing) treatment temperature of 430° C. for 30 minutes, and a test piece (chip) including a thermoelectric conversion material and having a thickness of 200 μm was obtained (a thermoelectric conversion material layer was formed).

Example 2

The "(1) preparation of thermoelectric semiconductor composition" and "(2) production of test piece (chip) including thermoelectric conversion material" were carried out in the same manner as in Example 1, except that "16.5 parts by mass of a polypropylene carbonate solution (QPAC 40 available from Empower Materials, Inc., solvent: N-methylpyrrolidone, solid content concentration: 20 mass %) containing polypropylene carbonate (final decomposition temperature: 300° C.) as a binder resin (solid content: 3.3 parts by mass)" was used in place of "16.5 parts by mass of a polyethylene carbonate solution (QPAC 25 available from Empower Materials, Inc., solvent: N-methylpyrrolidone, solid content concentration: 20 mass %) containing polyethylene carbonate (final decomposition temperature: 250° C.) as a binder resin (solid content: 3.3 parts by mass)" in Example 1.

Example 3

The "(1) preparation of thermoelectric semiconductor composition" and "(2) production of test piece (chip) including thermoelectric conversion material" were carried out in the same manner as in Example 1, except that "16.5 parts by mass of a polycyclohexene carbonate solution (QPAC 130 available from Empower Materials, Inc., solvent: N-methylpyrrolidone, solid content concentration: 20 mass %) containing polycyclohexene carbonate (final decomposition temperature: 350° C.) as a binder resin (solid content: 3.3 parts by mass)" was used in place of "16.5 parts by mass of a polyethylene carbonate solution (QPAC 25 available from Empower Materials, Inc., solvent: N-methylpyrrolidone, solid content concentration: 20 mass %) containing poly-ethylene carbonate (final decomposition temperature: 250° C.) as a binder resin (solid content: 3.3 parts by mass)" in Example 1.

Example 4

The "(1) preparation of thermoelectric semiconductor composition" and "(2) production of test piece (chip) including thermoelectric conversion material" were carried out in the same manner as in Example 1, except that "16.5 parts by mass of a poly(propylene/cyclohexene) carbonate solution (QPAC 100 available from Empower Materials, Inc., solvent: N-methylpyrrolidone, solid content concentration: 20 mass %) containing poly(propylene/cyclohexene) carbonate (final decomposition temperature: 350° C.) as a binder resin (solid content: 3.3 parts by mass)" was used in place of "16.5 parts by mass of a polyethylene carbonate solution (QPAC 25 available from Empower Materials, Inc., solvent: N-methylpyrrolidone, solid content concentration: 20 mass %) containing polyethylene carbonate (final decomposition temperature: 250° C.) as a binder resin (solid content: 3.3 parts by mass)" in Example 1.

Example 5

The "(1) preparation of thermoelectric semiconductor composition" and "(2) production of test piece (chip) including thermoelectric conversion material" were carried out in the same manner as in Example 1, except that "a thermoelectric semiconductor composition prepared by mixing and dispersing 79.0 parts by mass of P-type bismuth telluride $Bi_{0.4}Te_{3.0}Sb_{1.6}$ particles (average particle size: 2.5 μm), 17.0 parts by mass of an ethyl cellulose solution (ETHOCEL 4CPS available from Nisshin Kasei Co., Ltd., solvent: N-methylpyrrolidone, solid content concentration: 5 mass %) containing ethyl cellulose (final decomposition temperature: 450° C.) as a binder resin (solid content: 0.85 parts by mass), and 3.95 parts by mass of 1-butylpyridinium bromide (IL-P18B available from KOEI CHEMICAL COMPANY, LTD.) as an ionic liquid" was used in place of the "thermoelectric semiconductor composition prepared by mixing and dispersing 77.0 parts by mass of the obtained P-type bismuth telluride $Bi_{0.4}Te_{3.0}Sb_{1.6}$ particles (average particle size: 2.5 μm), 16.5 parts by mass of a polyethylene carbonate solution (QPAC 25 available from Empower Materials, Inc., solvent: N-methylpyrrolidone, solid content concentration: 20 mass %) containing polyethylene carbonate (final decomposition temperature: 250° C.) as a binder resin (solid content: 3.3 parts by mass), and 6.5 parts by mass of 1-butylpyridinium bromide (IL-P18B available from KOEI CHEMICAL COMPANY, LTD.) as an ionic liquid" in Example 1.

Note that, when the ethyl cellulose as the binder resin was subjected to the firing (annealing) treatment in the argon-hydrogen mixed gas atmosphere at the firing (annealing) treatment temperature of 430° C. for 30 minutes, 95.3 mass % thereof decomposed (the mass of the ethyl cellulose after the firing (annealing) treatment was 4.7 mass % of the mass of the ethyl cellulose before the firing (annealing) treatment).

Comparative Example 1

The methods of "(1) preparation of thermoelectric semiconductor composition" and "(2) production of test piece (chip) including thermoelectric conversion material" were carried out in the same manner as in Example 1, except that "16.5 parts by mass of a polyamideimide solution (solvent:

N-methylpyrrolidone, solid content concentration: 20 mass %) containing polyamideimide (Composelan AI301 available from Arakawa Chemical Industries, Ltd., final decomposition temperature: higher than 600° C.) as a binder resin (solid content: 3.3 parts by mass)" was used in place of "16.5

Examples 1 and 2 was subjected to the "(a) measurement of a filling ratio in a longitudinal cross-section along a thickness direction" and "(b) evaluation of electrical properties (measurement of an electrical resistance value)". The results are shown in Table 1.

TABLE 1

| | Binder resin | | | | | |
|---|---|---|---|---|---|---|
| | Material type | Blended amount (mass %) | Final decomposition temperature (° C.) | Filling ratio | Electrical resistance value (mΩ) | Electrical resistivity (Ω · m) |
| Example 1 | Polyethylene carbonate | 3.3 | 250 | 0.980 | 68 | 0.0192 |
| Example 2 | Polypropylene carbonate | 3.3 | 300 | 0.947 | 71 | 0.0194 |
| Example 3 | Polycyclohexene carbonate | 3.3 | 350 | 0.913 | 103 | 0.0292 |
| Example 4 | Poly(propylene/cyclohexene) carbonate | 3.3 | 350 | 0.933 | 109 | 0.0309 |
| Example 5 | Ethyl Cellulose | 0.85 | 450 | 0.966 | 78 | 0.0221 |
| Comparative Example 1 | Polyamide-imide | 3.3 | Greater than 600 | 0.849 | 143 | 0.0404 |
| Comparative Example 2 | Polyamic acid | 3.3 | Greater than 600 | 0.849 | 159 | 0.0449 | parts by mass of a polyethylene carbonate solution (QPAC 25 available from Empower Materials, Inc., solvent: N-methylpyrrolidone, solid content concentration: 20 mass %) containing polyethylene carbonate (final decomposition temperature: 250° C.) as a binder resin (solid content: 3.3 parts by mass)" in Example 1.

Note that, when the polyamideimide was subjected to the firing (annealing) treatment in the argon-hydrogen mixed gas atmosphere at the firing (annealing) treatment temperature of 430° C. for 30 minutes, 3.2 mass % thereof decomposed (the mass of the polyamideimide after the firing (annealing) treatment was 96.8 mass % of the mass of the polyamideimide before the firing (annealing) treatment).

Comparative Example 2

The methods of "(1) preparation of thermoelectric semiconductor composition" and "(2) production of test piece (chip) including thermoelectric conversion material" were carried out in the same manner as in Example 1, except that "16.5 parts by mass of a polyamic solution (solvent: N-methylpyrrolidone, solid content concentration: 20 mass %) containing polyamic acid (U-Varnish A available from UBE Corporation, final decomposition temperature: higher than 600° C.) as a binder resin (solid content: 3.3 parts by mass)" was used in place of "16.5 parts by mass of a polyethylene carbonate solution (QPAC 25 available from Empower Materials, Inc., solvent: N-methylpyrrolidone, solid content concentration: 20 mass %) containing polyethylene carbonate (final decomposition temperature: 250° C.) as a binder resin (solid content: 3.3 parts by mass)" in Example 1.

Note that the polyamic acid was subjected to the firing (annealing) treatment in the argon-hydrogen mixed gas atmosphere at the firing (annealing) treatment temperature of 430° C. for 30 minutes, but did not decompose.

The test piece of the thermoelectric conversion material produced in each of Examples 1 to 5 and Comparative It can be seen that the test pieces (chips) including the thermoelectric conversion materials of Examples 1 to 5, in which the filling ratio of the thermoelectric conversion material in the longitudinal cross-section along the thickness direction of the thermoelectric conversion material layer is greater than 0.900 and less than 1.000, can have an electrical resistivity reduced more than that of the test pieces (chips) including the thermoelectric conversion materials of Comparative Examples 1 and 2 having the filling ratio of 0.900 or less.

INDUSTRIAL APPLICABILITY

It is conceivable that the thermoelectric conversion module of the present invention is applied to heat generation applications of converting exhaust heat from plants and various combustion furnaces such as waste combustion furnaces and cement combustion furnaces, combustion gas exhaust heat of automobiles, and exhaust heat of electronic equipment into electricity. As cooling applications, for example, the thermoelectric conversion module is applied, for example, to temperature control of central processing units (CPU) used in a smartphone, a variety of computers, and the like, image sensors such as a complementary metal oxide semiconductors (CMOS) and charge coupled devices (CCD), and further, micro electro mechanical systems (MEMS), a variety of sensors such as light receiving elements, and the like.

REFERENCE SIGNS LIST

1, 1a: Substrate
2a: Thermoelectric conversion material layer including P-type thermoelectric conversion material (P-type chip)
2b: Thermoelectric conversion material layer including N-type thermoelectric conversion material (N-type chip)
3: Solder receiving layer
4: Resin film 5: Electrode
6: Solder material layer (when formed)
6': Solder material layer (after joining)
12: Coating film of thermoelectric semiconductor composition
12a: Coating film
12b: Coating film
20, 20s, 20t: Thermoelectric conversion material layer
30: Void portion
30b: Void portion
40b: Void portion
X: Length (width direction)
Y: Length (depth direction)
D: Thickness (thickness direction)
Dmax: Maximum value of thickness in thickness direction (longitudinal cross-section)
Dmin: Minimum value of thickness in thickness direction (longitudinal cross-section)
C: Center portion of thermoelectric conversion material layer

The invention claimed is:

1. A thermoelectric conversion module comprising a thermoelectric conversion material layer, the thermoelectric conversion material layer comprising a thermoelectric conversion material containing a fired body of a coating film of a thermoelectric semiconductor composition comprising thermoelectric semiconductor particles, a polycarbonate binder resin, and at least one of an ionic liquid and an inorganic compound,
wherein the thermoelectric conversion material layer has voids, and
a proportion of an area occupied by the thermoelectric conversion material within an area of a longitudinal cross-section that includes a center portion of the thermoelectric conversion material layer, defined as a filling ratio, is greater than 0.900 and less than 1.000.

2. The thermoelectric conversion module according to claim 1, wherein the binder resin decomposes by 90 mass % or greater at a firing temperature of the fired body.

3. The thermoelectric conversion module according to claim 1, wherein the thermoelectric semiconductor composition comprises an ionic liquid.

4. The thermoelectric conversion module according to claim 1, wherein the thermoelectric semiconductor particles comprise a bismuth-tellurium-based thermoelectric semiconductor material, a telluride-based thermoelectric semiconductor material, an antimony-tellurium-based thermoelectric semiconductor material, or a bismuth selenide-based thermoelectric semiconductor material.

5. The thermoelectric conversion module according to claim 1, wherein the thermoelectric semiconductor particles comprise particles of $Bi_XTe_3Sb_{2-X}$ where X is $0.4 \leq X \leq 0.6$.

6. The thermoelectric conversion module according to claim 1, wherein the thermoelectric semiconductor particles comprise particles of $Bi_2Te_{3-Y}Se_Y$ where Y is $0 < Y \leq 2.7$.

7. The thermoelectric conversion module according to claim 1, wherein an average particle size of the thermoelectric semiconductor particles is from 10 to 30 μm.

8. The thermoelectric conversion module according to claim 1, wherein an average particle size of the thermoelectric semiconductor particles is from 1 to 6 μm.

9. The thermoelectric conversion module according to claim 1, wherein the filling ratio is 0.950 or greater and 0.999 or less.

10. The thermoelectric conversion module according to claim 1, wherein the filling ratio is 0.970 or greater and 0.999 or less.

11. The thermoelectric conversion module according to claim 1, wherein a content of thermoelectric semiconductor particles in the thermoelectric conversion material is from 8 to 100 mass %.

12. The thermoelectric conversion module according to claim 1, wherein a content of the thermoelectric semiconductor particles in the thermoelectric conversion material is from 95 to 100 mass %.

13. The thermoelectric conversion module according to claim 1, wherein a content of the thermoelectric semiconductor particles in the thermoelectric conversion material is from 99.9 to 100 mass %.

14. The thermoelectric conversion module according to claim 1, wherein the thermoelectric semiconductor composition comprises an inorganic ionic compound.

15. The thermoelectric conversion module according to claim 1, wherein the thermoelectric semiconductor composition comprises an ionic liquid and an inorganic ionic compound.

* * * * *